(12) United States Patent
Standing et al.

(10) Patent No.: US 9,974,187 B2
(45) Date of Patent: May 15, 2018

(54) POWER IN LEAD

(71) Applicants: Martin Standing, Villach (AT);
Andrew Roberts, Wrexham (GB);
Milko Paolucci, Villach (AT)

(72) Inventors: Martin Standing, Villach (AT);
Andrew Roberts, Wrexham (GB);
Milko Paolucci, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 511 days.

(21) Appl. No.: 13/867,243

(22) Filed: Apr. 22, 2013

(65) Prior Publication Data

US 2014/0311794 A1 Oct. 23, 2014

(51) Int. Cl.
*H05K 1/18* (2006.01)
*H05K 1/02* (2006.01)

(52) U.S. Cl.
CPC ........... *H05K 1/189* (2013.01); *H05K 1/0262* (2013.01)

(58) Field of Classification Search
CPC ............ H05K 1/189; H05K 1/18; H05K 1/16; H05K 1/0262; H05K 1/112; H02M 3/00; H01B 7/08
USPC ........ 174/70 R, 68.1, 250, 268, 74 R, 117 F, 174/117 FF; 361/748, 749, 750, 751, 361/784, 717
See application file for complete search history.

(56) References Cited

U.S. PATENT DOCUMENTS

| | | | | |
|---|---|---|---|---|
| 3,805,213 | A * | 4/1974 | Austin | 174/117 FF |
| 4,716,500 | A * | 12/1987 | Payne | 361/750 |
| 5,008,656 | A * | 4/1991 | Cheriff | H05K 1/112 |
| | | | | 361/717 |
| 5,669,775 | A | 9/1997 | Campbell et al. | |
| 5,926,369 | A | 7/1999 | Ingraham et al. | |
| 6,911,835 | B2 | 6/2005 | Chraft et al. | |
| 7,267,552 | B2 * | 9/2007 | Lin et al. | 174/117 FF |
| 7,381,064 | B2 * | 6/2008 | Bolen et al. | 174/117 FF |
| 7,948,762 | B2 * | 5/2011 | Castillo Garcia et al. | 361/749 |
| 7,960,817 | B2 | 6/2011 | Gerbsch et al. | |
| 8,043,115 | B2 * | 10/2011 | Zieger | 439/502 |
| 8,508,947 | B2 * | 8/2013 | Ganesan et al. | 174/117 FF |
| 8,872,032 | B2 * | 10/2014 | Lin et al. | 174/117 F |
| 8,878,064 | B2 * | 11/2014 | Chien et al. | 174/117 F |

FOREIGN PATENT DOCUMENTS

| | | |
|---|---|---|
| CN | 1071535 | 9/2001 |
| CN | 1653340 A | 8/2005 |
| DE | 10 2007 038 676 A1 | 2/2009 |
| WO | 2009021633 A1 | 2/2009 |

* cited by examiner

*Primary Examiner* — Angel R Estrada
(74) *Attorney, Agent, or Firm* — Slater Matsil, LLP

(57) ABSTRACT

Representative implementations of devices and techniques provide off-board power conversion. A power cable is arranged to distribute power from a power supply to a peripheral component. An active circuit is integrated into the cable, converting the power en route from the power supply to the peripheral component.

24 Claims, 5 Drawing Sheets

POWER IN LEAD

BACKGROUND

As modern technology shrinks the size of electronic devices, board space for circuits and systems (such as power supplies, for example) likewise decreases. However, in many cases, the requirements (such as power output, for example) of the circuits and systems do not decrease proportionately. This means that a modern circuit or system generally has a lesser area (or footprint) to work with than earlier generations, and it may have an equal or greater output requirement per unit area.

Conventionally, the power supply network for a compact electronic device is mounted on the motherboard. Often, peripheral connections, such as USB sockets for example, are also built onto the motherboard. Advantages may be gained by compacting or integrating portions of the electronic device, particularly if it saves board space.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
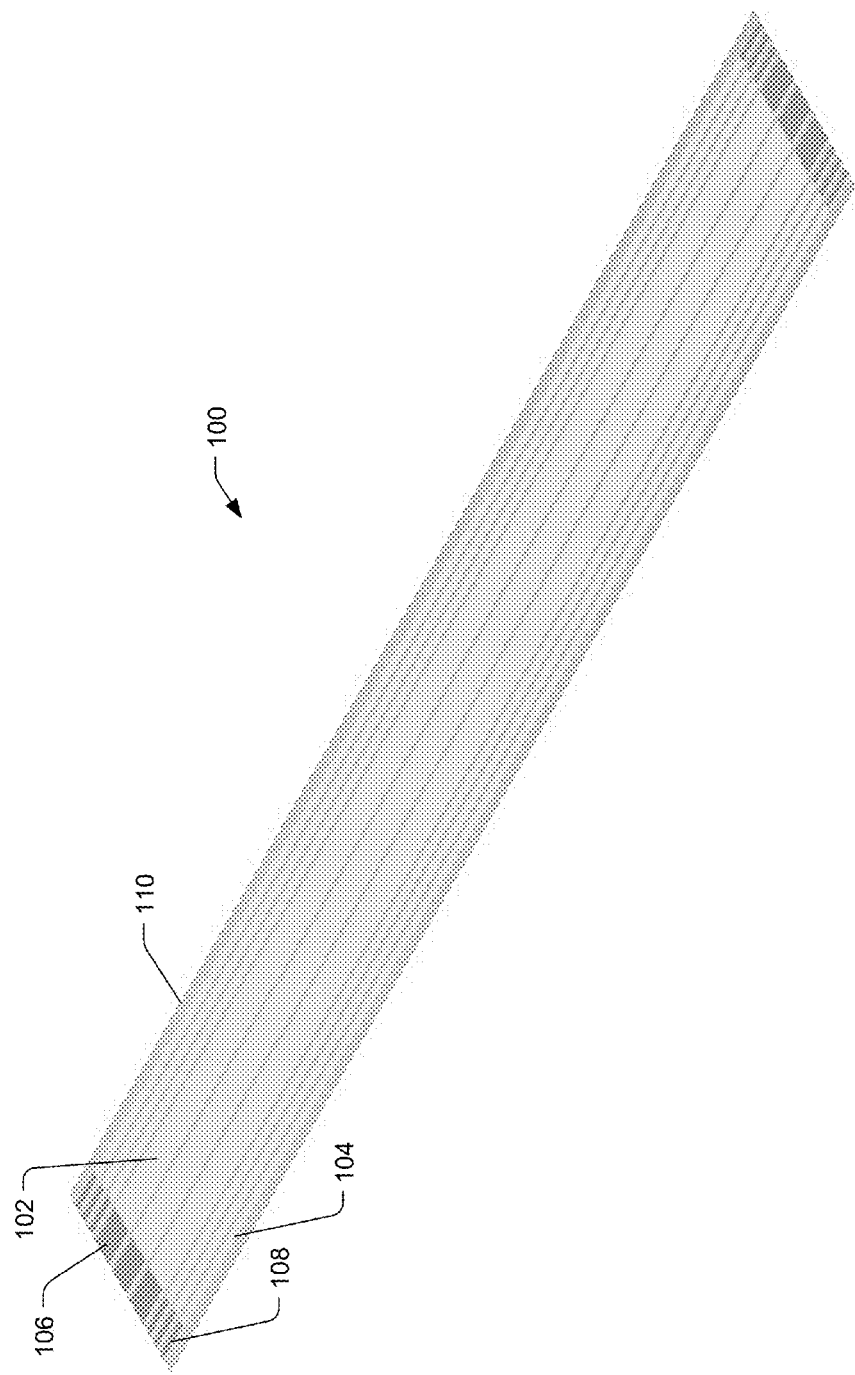
FIG. 1 is a perspective view of an example power cable arrangement, according to an implementation.

Techniques are described herein for removing peripheral power supply networks from the mother board (or other PCB), thus freeing space on the board(s). Representative implementations of devices and techniques provide off-board power conversion, including integrating power conversion onto a power cable.

In an implementation, a power cable (such as a flex-lead, for example) is arranged to distribute power from a power supply to a peripheral component. An active circuit is integrated into the cable, and arranged to condition the power distributed to the peripheral component. In an implementation, the active circuit is arranged to convert the power to a predetermined voltage suitable for the peripheral component, en route from the power supply to the peripheral component.

In some implementations, the power cable includes one or more conductors comprising multiple segments. For example, the one or more conductors may include a discontinuous gap between the segments. In an implementation, the gap is arranged to receive the active circuit integrated into the cable. In one example, the active circuit includes multiple contacts (e.g., pads, terminals, etc.). In one implementation, ends of the segments adjacent to the gap include terminations arranged to be electrically coupled to the multiple contacts of the active circuit.

In an implementation, the active circuit comprises a direct-current to direct-current (dc-dc) conversion circuit. In another implementation, the active circuit is arranged to output a predefined voltage based on the peripheral component. For example, the active circuit (and the power cable that the active circuit is integrated into) may be matched for the peripheral component. In the implementation, the cable and the incorporated power supply circuit(s) comprise a full power converter stage that is specified and may be fully tested (e.g., plug and play). In another implementation, compact packaging technologies are used, where one or more electrical devices, such as transistors and the like, are embedded within a multiple layer PCB of the active circuit.

Various implementations and arrangements are discussed with reference to electrical and electronics components and varied carriers. While specific components (i.e., integrated circuits, transistors, resistors, capacitors, inductors, chokes, etc.) or systems (i.e., dc-dc converters, synchronous-buck converters, etc.) are mentioned, this is not intended to be limiting, and is for ease of discussion and illustrative convenience. The techniques and devices discussed with reference to a power conversion circuit are applicable to any type or number of electrical components (e.g., sensors, transistors, diodes, etc.), circuits (e.g., integrated circuits, analog circuits, digital circuits, mixed circuits, ASICS, memory devices, processors, etc.), groups of components, packaged components, structures, devices, and the like, that may be integrated into a cable, such as a power cable, or the like. Further, the techniques and devices discussed with reference to discrete components are applicable to any type or number of discrete circuit components (e.g., resistors, capacitors, inductors, chokes, coils, memristors, etc.), groups of components, and the like. Additionally, the techniques and devices discussed with reference to a printed circuit board (PCB) are applicable to other types of carriers (e.g., board, chip, wafer, substrate, package, container, can, module, etc.) that electrical devices may be mounted fully or partially on or within.

Implementations are explained in more detail below using a plurality of examples. Although various implementations and examples are discussed here and below, further implementations and examples may be possible by combining the features and elements of individual implementations and examples.

Example Power in Lead Arrangement

FIG. 1 is a perspective view of an example power cable 100, according to an implementation. The cable 100 represents an example environment whereby the techniques and devices discussed herein may be applied. For example, the cable 100 may be arranged to distribute power (and/or another signal or signals) to a peripheral component, or the like. In an implementation, the cable 100 is arranged to receive power from a power supply at one end of the cable, and to distribute power to one or more peripheral components at the other end of the cable.

As shown in FIG. 1, an example power cable 100 may include one or more conductors 102, arranged to transmit power, for example, from one end of the power cable 100 to the other end of the power cable 100. In some implementations, the power cable 100 may also include one or more conductors 104 arranged to transmit a signal, for example, from one end of the power cable 100 to the other end of the power cable 100.

In various implementations, the conductors 102 and/or 104 may include terminals (e.g., contacts, pads, connectors, couplers, fittings, etc.) 106 and 108 respectively at one or more of the ends of the conductors 102 and 104. For example, the terminals 106, 108 may be arranged to electrically couple or physically and electrically couple the conductors 102, 104 to electrical components, other cables, circuits, modules, and the like.

As shown in FIG. 1, in an implementation, the cable 100 is a ribbon-type cable. For example, as shown, the cable 100 includes multiple conductors 102 and/or 104. In various implementations, the cable 100 may include any quantity of conductors 102 and/or 104 and remain within the scope of the disclosure.

Further, in an implementation, the cable 100 may include a covering (i.e., insulation, sheath, etc.) 110 over one or more of the conductors 102, 104. For example, the covering 110 may comprise a polyimide, polyester, or polyethylene terephthalate (PET), for example. In an implementation, the ends of the conductor 102, 104 are exposed, allowing for a connection to be made within a connector, a housing, by direct connection, or the like.

Figure 2:
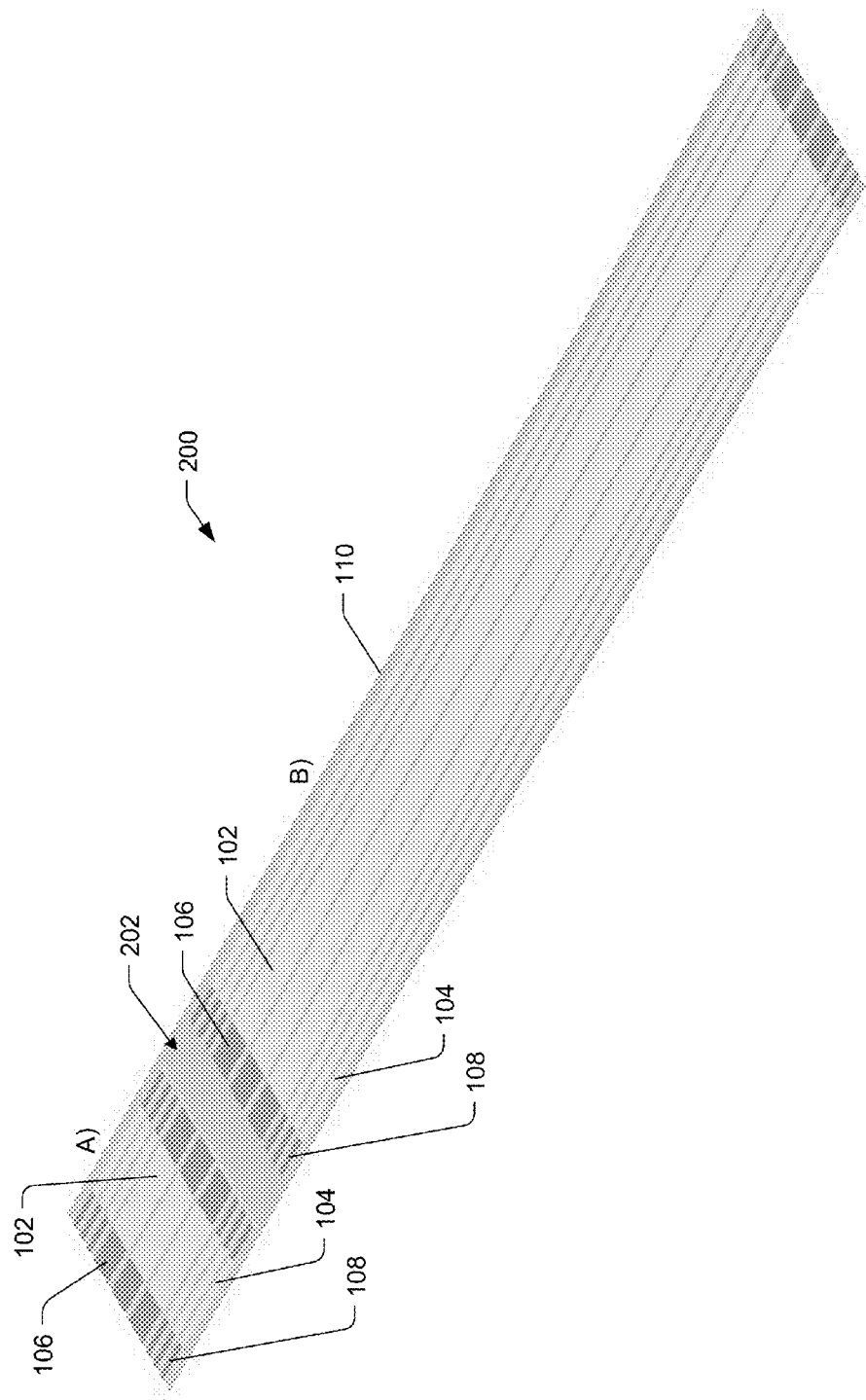
FIG. 2 is a perspective view of an example power cable arrangement, including segmented conductors, according to an implementation.

FIG. 2 is a perspective view of an example power cable arrangement 200, including segmented conductors 102, 104, according to an implementation. In an implementation, the cable 200 comprises the cable 100, and also includes the segmented conductors 102, 104, as well as a gap 202. In various implementations, the cable 100 includes one or more conductors 102, 104 comprising multiple segments (A and B, for example). For example, as shown in FIG. 2, the conductor(s) 102, 104 are partitioned or segmented into two or more segments (A and B) each.

In an implementation, the segments (A and B) of the conductors 102, 104 also include terminals 106 and 108, respectively, at one or both ends of the segments (A and B). In FIG. 2, only one end of each segment (A and B) is labeled for clarity.

Also as shown in FIG. 2, the one or more segmented conductors 102, 104 include a discontinuous gap 202 between the segments (A and B). The gap 202 represents a portion of the cable 100 where there is a discontinuity between the segments (A and B) of the conductors 102, 104. In an implementation, the gap 202 provides for a portion of the cable 100 where a circuit, for example, may be inserted and integrated into the cable 100, as discussed further below.

In the example of FIG. 2, all conductors 102, 104 of the cable 100 are discontinuous at the gap 202. However, in various implementations, one or more conductors 102 and/or 104 may be continuous through the gap 202. In such implementations, one or more conductors 102, 104 that are to be coupled to an inserted circuit are segmented, and other conductors 102, 104 that are not arranged to be coupled to an inserted circuit may not be segmented, but may remain continuous through the gap 202.

Figure 3:
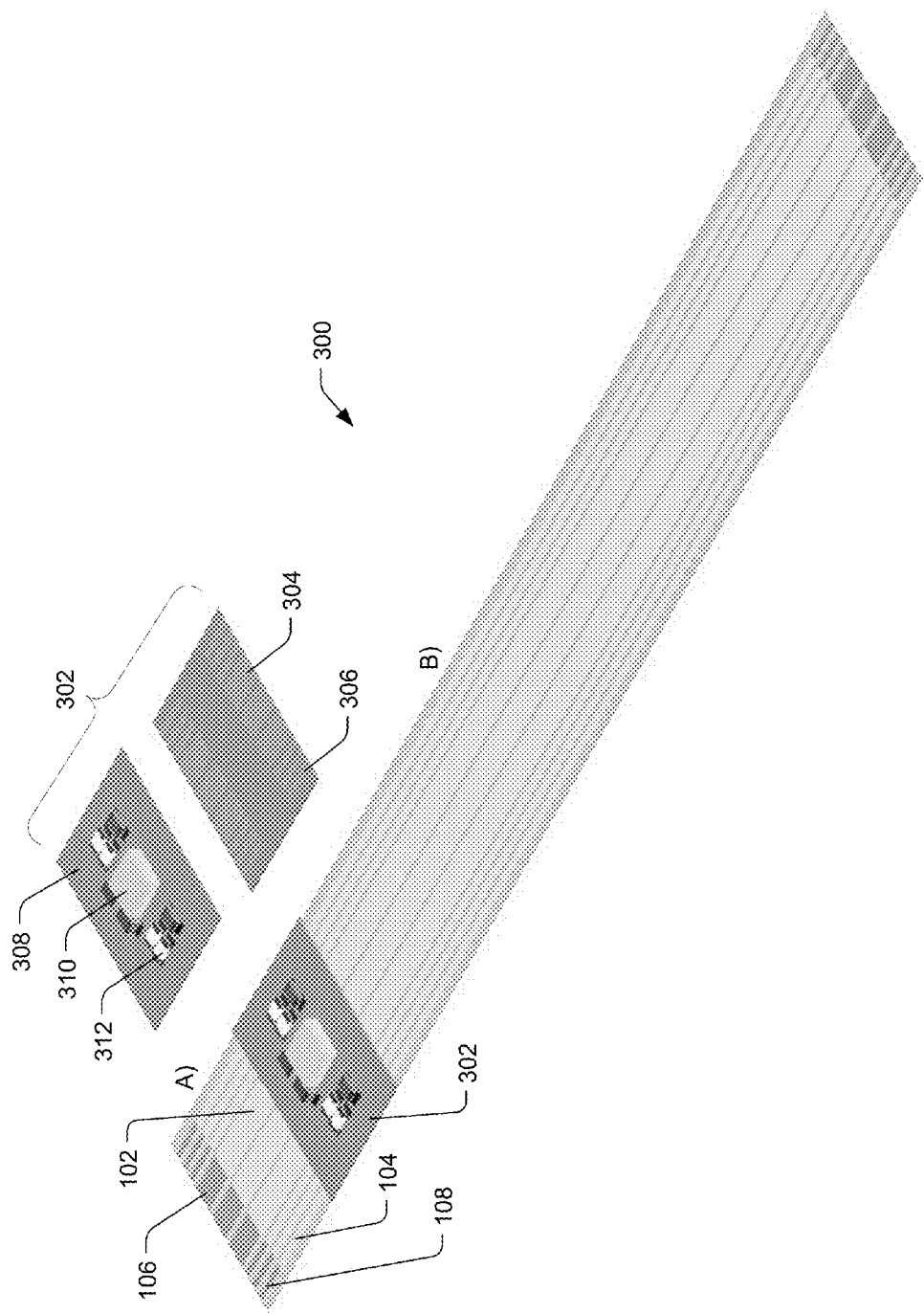
FIG. 3 is a perspective view of an example power cable arrangement, including an active circuit, according to an implementation. Also shown are a topside view and an underside view of the example active circuit, according to an implementation.

FIG. 3 is a perspective view of an example power cable arrangement 300, including an active circuit 302, according to an implementation. Also shown are a topside view and an underside view of the example active circuit 302, according to one implementation. In various implementations, the circuit 302 may include various different types of circuits, designs, materials, components, and the like. In these implementations, the circuit 302 is integrated into the cable 300, forming a modular unit comprising at least the cable 200 and the circuit 302. In alternate implementations, the cable 300 may include more than one circuit 302 and/or other components, circuits, and the like.

In an implementation, the cable 300 comprises the cable 200, and also includes the active circuit 302. In an implementation, the active circuit is integrated into the cable 300 and is arranged to condition power distributed to a peripheral component. In various implementations, the cable 300 includes one or more conductors 102, 104 comprising multiple segments (A and B). In the implementations, the one or more conductors 102, 104 include a discontinuous gap 202 between segments (A and B), where the gap is arranged to receive the active circuit 302. For example, as shown in FIG. 3, the active circuit 302 may be arranged to insert and integrate into the gap 202 of the cable 300.

As shown in the underside view of the active circuit 302 in FIG. 3, in an implementation, the active circuit 302 includes multiple contacts 304, 306. In one implementation, the terminations 106, 108 at ends of the segments (A and B) adjacent to the gap 202 are arranged to be electrically coupled to the multiple contacts 106, 108. For example, the contacts 304, 306 on the active circuit 302 may be arranged to match the terminations 106, 108 on the cable 300. Accordingly, the circuit 302 may be inserted onto the cable 300 at the gap 202, and the terminations 106, 108 may be electrically or physically and electrically coupled to the contacts 304, 306.

In an implementation, the contacts 304, 306 of the active circuit 302 are arranged to include inputs and/or outputs of the active circuit 302. For example, in one implementation, the circuit 302 comprises a direct-current to direct-current (dc-dc) conversion circuit. In the implementation, the dc-dc conversion circuit 302 is arranged to output a predefined voltage based on the peripheral component arranged to receive the converted power. For instance, the dc-dc conversion circuit 302 may be tailored to the specifications of a particular peripheral component. In an implementation, the dc-dc conversion circuit 302 comprises a synchronous-buck-type power conversion circuit. In alternate implementations, the circuit 302 comprises a different type of power conditioning circuit (e.g., a rectifying circuit, a filtering circuit, a transforming circuit, a transient protection circuit, etc.).

In an implementation, the active circuit 302 includes one or more active components (e.g., transistors, etc.) embedded within layers of a printed circuit board (PCB) 308. The PCB 308 represents any of various types of carriers (e.g., board, chip, wafer, substrate, package, container, can, etc.) that an electrical component may be mounted fully or partially on or within. As shown in FIG. 3, the active circuit 302 may include one or more passive devices 310, 312 mounted to a surface of the PCB 308. In various implementations, the passive devices 310, 312 may be deliberately placed on the PCB 308 to optimize performance of the active circuit 302, including optimizing thermal management of the active device(s) embedded within the PCB 308, as discussed further below.

In various implementations, the embedding technologies used result in power supply architectures that are very compact. Thus, in some implementations, the fully integrated power circuit 302 does not add significantly to the area occupied by a cable assembly 300. Accordingly, valuable area of the motherboard, or other PCB, may be freed of one or more power conversion architectures. In an implementation, cables 300 having circuits 302 can be fitted between and around other devices (for example; hard disk devices, cooling fans, loudspeaker assemblies and other drives) within an enclosure. Further, the cable 300 design may help to distribute thermal loading around the environment (e.g., case of the equipment, etc.) rather than increasing the power density and thermal loading of the motherboard.

The techniques, components, and devices described herein with respect to the cable arrangement 300 are not limited to the illustrations in FIGS. 1-3, and may be applied to other designs, types, arrangements, and constructions including other electrical components without departing from the scope of the disclosure. In some cases, alternative components may be used to implement the techniques described herein. In various implementations, the cable arrangement 300 may be a stand-alone module, or it may be an integral portion of a system, component, structure, or the like.

Example Implementations

Figure 4:
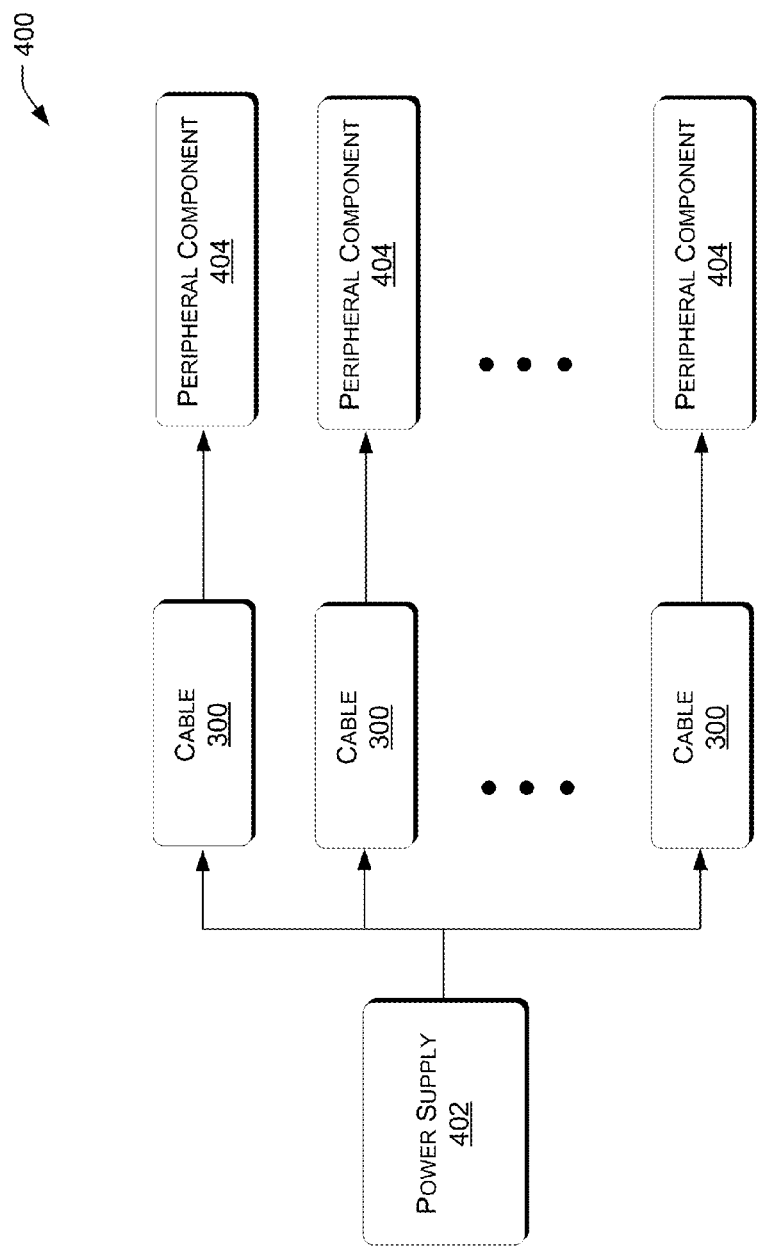
FIG. 4 is a block diagram of an example system including one or more power cable arrangements, arranged to distribute power to one or more peripheral components, according to an implementation.

FIG. 4 is a block diagram of an example system 400 (e.g., a computing device, a communications device, a mobile device, a vehicle, a robot, an industrial machine, etc.) including one or more power cable arrangements 300, arranged to distribute power to one or more peripheral components 404, according to an implementation. In various implementations, a peripheral component may include a module, a system, a device, or the like, that is remote from the core of the electronic device, and generally receives power from the electronic device. For example, in the case of a mobile computing device, a peripheral component may include an internal or external input/output component (e.g., keypad, display, etc.), an internal or external memory storage component (e.g., disk drive, solid-state drive, Universal Serial Bus (USB) drive, etc.), an interface port (e.g., USB port, etc.), and the like. Various types of peripheral components, associated with various types of electrical and/or electronic devices or systems are included within the scope of the disclosure.

In an implementation, a system 400 may include a power supply 402, a peripheral component 404 arranged to operate at a predetermined voltage, and a multi-conductor power cable 300 having an integrated power conversion circuit 302 arranged to receive an output of the power supply and to output the predetermined voltage to the peripheral component 404. For example, the cable 300 may be matched to the specifications of the peripheral component 404.

As shown in FIG. 4, in an implementation, the system 400 may include multiple additional peripheral components 404 arranged to operate at multiple respective predetermined voltages. In the implementation, the system includes multiple additional power cables 300 with integrated power conversion circuits 302, where each of the multiple additional power cables 300 is arranged to receive an output of the power supply 402 and to output a respective predetermined voltage to a respective additional peripheral component 404. For example, the respective cables 300 may be matched to the specifications of the respective peripheral component 404. In some implementations, each peripheral component 404 may have a different input voltage specification. In those cases, the active circuit 302 of each cable 300 is arranged to output the specified voltage for the respective peripheral component 404.

As shown in FIGS. 3 and 4, in an implementation, the power for the peripheral component 404 is converted to the predetermined voltage en route to the peripheral component 404. In other words, the active circuit 302 integrated into each cable 300 is arranged to convert the power output from the power supply 402 to the specified (predetermined) power for each peripheral component 404 between receiving power from the power supply 402 at one end of the cable 300 and delivering power to the peripheral component 404 at the other end of the cable 300. In such an implementation, the power cable 300 comprises a plug-and-play component, matched to the peripheral component 404, based on operating specifications of the peripheral component 404, including the predetermined voltage.

In one implementation, the power cable 300 includes one or more signal conductors (such as conductor 104, for example) arranged to provide signal transmission to and/or from the peripheral component 404. For example, the signal may include an on/off signal, an attenuation signal, or the like. In an alternate implementation, the signal transmitted may include data, communications, or the like.

In various implementations, the cable 300, including the gap 202 and the circuit 302, may be provided as the result of various manufacturing processes, according to various implementations. For example, in an implementation, metallic conductors 102, 104 may be formed in a continuous ribbon (for example a copper conductor of 1.00 mm width and 0.15 mm in height). A single conductor 102, 104 or multiple conductors 102, 104 may be drawn from a roll concurrently and adhered to one side of a cover 110 (such as cover tape, for example). Another cover 110 side can be pressed onto the top of the conductors 102, 104, and the assembly sheathed within the two sides of the cover 110. The cover 110 may be coated with an adhesive material, such as a thermo-setting material, which can later be cured.

In an implementation, the conductors 102, 104 may be plated (e.g., prior to covering) with a finish that supports or promotes a mechanical termination, such as soldering or spot-welding, for example. Thin coatings of noble or semi-noble materials, such as platinum, gold, silver, etc. may be applied for these purposes, either continuously or in a spot format (i.e., only in the location(s) needed).

Other manufacturing techniques include using a cover 110 with apertures for connections cut into the cover material. In alternate implementations, the apertures may either be pre-cut or cut during the assembly process. Apertures may be cut in either the top side or the bottom of the cover 110 for connection to the circuit 302 containing the power conversion architecture. In some cases it may be desirable to have small apertures on the opposite-side of the cover 110 to support certain processing options (e.g., spot welding etc.).

In an implementation, the conductors 102, 104 may be cut into segments (e.g., segments A and B) during the bonding process, for example. In various implementations, it is possible to cut the conductors 102, 104 into segments (A and B) within a single cable 300, allowing the integration of a circuit 302 between one segment (A) and the other segment (B). For example, in one implementation, the circuit 302 may be inserted into the cable 300 near the point of the peripheral 404 load.

In an implementation, the circuit 302 is mounted directly to the cable 300 and becomes a permanently integrated part of the cable 300. The circuit 302 can be mounted using a simple soldering operation, which may be accompanied by an additional gluing process, for example. However, another solution may be to weld it in a similar process to conventional spot-welding. This can create a very high performance connection that is permanent, but requires little heat budget. Spot-welding can also allow the possibility to use a wider range of dielectrics.

In an implementation, a circuit 302 may be designed and laid out on a multi-layer PCB 308 for optimized performance of the circuit elements, including optimized thermal performance. For example, the circuit 302 may be designed and laid out such that the circuit elements have optimized speed of operation, impedance characteristics, functional characteristics, power consumption profiles, parasitic performance, longevity, and the like, and also provide optimized management of heat generated by the circuit elements (and particularly the embedded active components).

In an implementation, the placement of the passive electrical component(s) 310, 312 with respect to the embedded component(s) (e.g., power semiconductor devices, etc.) provides optimized performance (e.g., power efficiency, speed, etc.) of the circuit 302, based on optimized conductor paths (e.g., minimal length, preferred path, low impedance coupling, etc.).

In alternate implementations, one passive component 310, 312 (such as an inductor, for example) may be included in a circuit 302, where the passive component 310, 312 (or multiple passive components 310, 312) may be strategically located on an outer surface the PCB 308 and arranged to conduct heat generated by the embedded active component away from the embedded active component. The proximity of the passive component 310, 312 allows heat generated by the embedded active component to be thermally conducted to the passive component 310, 312 either by direct contact or through thermal capacitance, and dissipated into the environment. For example, the passive component 310, 312 may be deliberately or strategically placed above or below the embedded active component.

Different configurations for a cable arrangement 300 or a system 400 may be possible with different implementations. In alternate implementations, various other combinations and designs of the cable arrangement 300 and system 400 are also within the scope of the disclosure. The variations may have fewer elements than illustrated in the examples shown in FIGS. 1-4, or they may have more or alternative elements than those shown.

Representative Process

Figure 5:
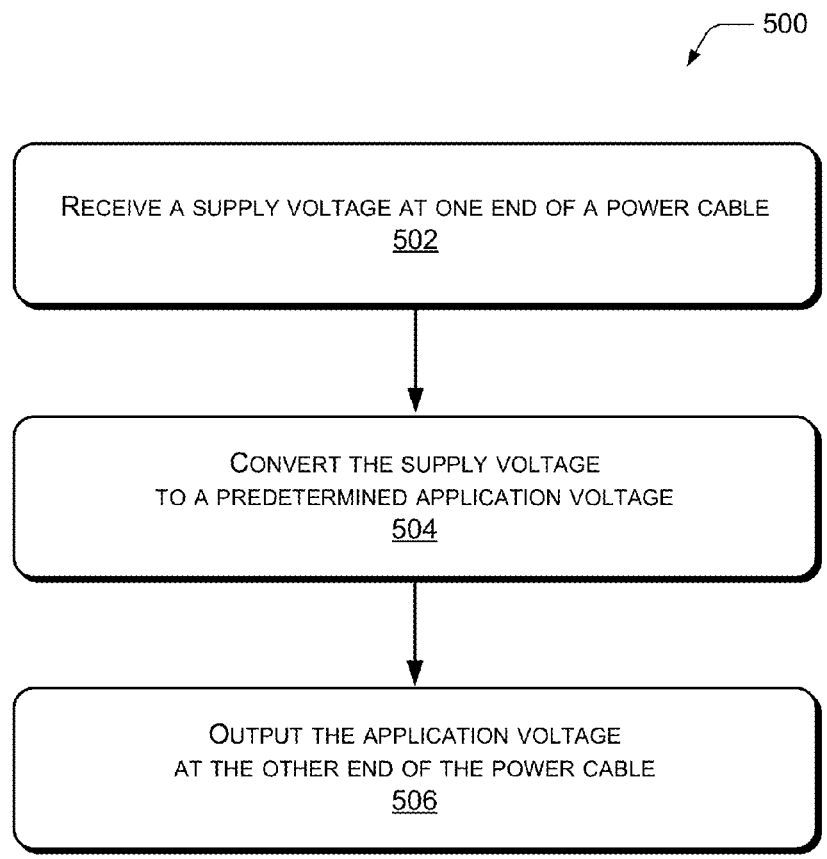
FIG. 5 is a flow diagram illustrating an example process for integrating power conversion into a power cable, according to an implementation.

FIG. 5 illustrates a representative process 500 for integrating power conversion into a power cable. For example, an active circuit (such as active circuit 302, for example) may be integrated into a power cable (such as power cable 300, for example), where the active circuit provides conditioned power to a peripheral component via the cable. In various implementations, the system including the cable and the circuit are matched to the specifications of the peripheral component. The process 500 is described with reference to FIGS. 1-4.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 502, the process includes receiving a supply voltage at one end of a power cable (such as power cable 300, for example).

At block 504, the process includes converting the supply voltage to a predetermined application voltage. In an implementation, the supply voltage is converted to a predetermined application voltage within the length of the power cable.

In an implementation, the process includes converting the supply voltage to the predetermined application voltage using a power conversion circuit (such as active circuit 302, for example) that is integrated into the power cable. In alternate implementations, the process includes conditioning the power using another type of power conditioning circuit (e.g., a rectifying circuit, a filtering circuit, a transforming circuit, a transient protection circuit, etc.).

At block 506, the process includes outputting the application voltage at the other end of the power cable. For example, the application voltage may be output to a peripheral component (such as peripheral component 404, for example), or to a power port arranged to serve the peripheral component, for example.

In an implementation, the process includes segmenting one or more conductors of the power cable into multiple segments. In the implementation, the one or more conductors include a discontinuous gap (such as gap 202, for example) between segments of the multiple segments, where the gap is arranged to receive an active circuit.

In one implementation, the process includes electrically coupling the active circuit to terminations (such as terminations 106, 108, for example) arranged at ends of the segments adjacent to the gap. In a further implementation, the process includes soldering or spot-welding contacts (such as contacts 306, 304, for example) of the active circuit to the terminations.

In an example implementation, the process includes coupling one end of a segment of a first conductor to a power supply, coupling another end of the segment of the first conductor to an input of a power conversion circuit, coupling one end of another segment of the first conductor to an output of the power conversion circuit, and coupling another end of the other segment of the first conductor to a peripheral power input.

In one implementation, the process includes pre-cutting one or more apertures in insulation covering the first conductor prior to coupling the power conversion circuit to the first conductor. In the implementation, the process includes pre-cutting the one or more apertures in the insulation prior to covering the first conductor with the insulation.

In a further implementation, the process includes transmitting a signal over a conductor of the power cable. In alternate implementations, the transmission conductor may be segmented or continuous over the length of the cable. For example, the signal transmission may pass through circuitry (such as a filter, for example) contained on the PCB of the active circuit.

In various implementations, the PCB may have any number of layers. In one implementation, the process includes embedding one or more electrical components (such transistors, for example) within layers of the PCB of the active circuit. In another implementation, the process includes strategically locating a passive component with respect to the embedded electrical component. In one example, the process includes arranging one or more of the passive components with respect to the electrical component such that the passive component(s) conducts heat generated by the electrical component away from electrical component.

In a further implementation, the process includes aligning one or more of the passive components with respect to the electrical component such that a conduction path length between the electrical component and the passive component(s) is minimized.

In various implementations, the various components (including the passive component) may be coupled to a layer of the PCB using various techniques (e.g., soldering, press-fit, connectors, surface mount technologies, through-hole technology, and so forth).

In various implementations, the passive components are selected from a set comprising: resistors, capacitors, inductors, transformers, chokes, heat sinks, and the like. In alternate implementations, the passive components may be comprised of other devices, elements, circuits, and the like.

In alternate implementations, other techniques may be included in the process 500 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus, comprising:
   a cable arranged to distribute power to a peripheral component; and
   an active circuit integrated into the cable and arranged to condition the power distributed to the peripheral component, wherein the active circuit comprises a direct-current to direct-current (dc-dc) conversion circuit.

2. The apparatus of claim 1, wherein the cable includes one or more conductors comprising multiple segments, the one or more conductors including a discontinuous gap between segments of the multiple segments, the gap arranged to receive the active circuit.

3. The apparatus of claim 2, wherein the active circuit includes multiple contacts and wherein ends of segments adjacent to the gap include terminations arranged to be electrically coupled to the multiple contacts.

4. The apparatus of claim 3, wherein contacts of the multiple contacts of the active circuit are arranged to comprise inputs or outputs of the active circuit.

5. The apparatus of claim 1, wherein the cable includes one or more power conductors and one or more signal conductors.

6. The apparatus of claim 1, wherein the dc-dc conversion circuit is arranged to output a predefined voltage based on the peripheral component.

7. The apparatus of claim 1, wherein the dc-dc conversion circuit comprises a synchronous-buck-type power conversion circuit.

8. The apparatus of claim 1, wherein the active circuit includes one or more active electrical components embedded within layers of a printed circuit board (PCB).

9. The apparatus of claim 1, wherein the cable comprises a flexible ribbon-type cable.

10. A system, comprising:
    a power supply;
    a peripheral component arranged to operate at a predetermined direct current (dc) voltage; and
    a multi-conductor power cable having an integrated power conversion circuit arranged to receive an output of the power supply and to output the predetermined dc voltage to the peripheral component, the integrated power conversion circuit comprising active circuitry.

11. The system of claim 10, further comprising:
    multiple additional peripheral components arranged to operate at multiple respective predetermined dc voltages; and
    multiple additional power cables with integrated power conversion circuits, wherein each of the multiple additional power cables is arranged to receive an output of the power supply and to output a respective predetermined dc voltage to a respective additional peripheral component.

12. The system of claim 10, wherein power for the peripheral component is converted to the predetermined dc voltage en route from the power supply to the peripheral component.

13. The system of claim 10, wherein the power cable comprises a plug-and-play arrangement, matched to the peripheral component, based on operating specifications of the peripheral component, including the predetermined dc voltage.

14. The system of claim 10, wherein the power cable includes one or more signal conductors arranged to provide signal transmission to and/or from the peripheral component.

15. A method, comprising:
    receiving a supply voltage at one end of a power cable;
    converting the supply voltage to a predetermined direct current (dc) application voltage using active circuitry; and
    outputting the predetermined dc application voltage at the other end of the power cable.

16. The method of claim 15, further comprising converting the supply voltage to the predetermined dc application voltage using a power conversion circuit integrated into the power cable.

17. The method of claim 15, further comprising segmenting one or more conductors of the power cable into multiple segments, the one or more conductors including a discontinuous gap between segments of the multiple segments, the gap arranged to receive an active circuit.

18. The method of claim 17, further comprising electrically coupling the active circuit to terminations arranged at ends of the segments adjacent to the gap.

19. The method of claim 18, further comprising soldering or spotwelding contacts of the active circuit to the terminations.

20. The method of claim 15, further comprising:
    coupling one end of a segment of a first conductor of the power cable to a power supply;
    coupling another end of the segment of the first conductor to an input of a power conversion circuit;
    coupling one end of another segment of the first conductor to an output of the power conversion circuit; and
    coupling another end of the other segment of the first conductor to a peripheral power input.

21. The method of claim 20, further comprising pre-cutting one or more apertures in insulation covering the first conductor prior to coupling the power conversion circuit to the first conductor.

22. The method of claim 21, further comprising pre-cutting the one or more apertures in the insulation prior to covering the first conductor with the insulation.

23. The method of claim 15, further comprising transmitting a signal over a conductor of the power cable.

24. An apparatus, comprising:
- a multi-conductor ribbon cable arranged to distribute a predetermined voltage to a peripheral component, the cable comprising one or more partitioned conductors including a discontinuous gap between segments of the partitioned conductors; and
- a direct-current to direct-current (dc-dc) conversion circuit inserted into the gap between the segments and electrically coupled to the segments, such that the circuit is arranged to receive an output of a power supply from one or more of the segments and to output the predetermined voltage on one or more others of the segments.

* * * * *

UNITED STATES PATENT AND TRADEMARK OFFICE
CERTIFICATE OF CORRECTION

PATENT NO. : 9,974,187 B2
APPLICATION NO. : 13/867243
DATED : May 15, 2018
INVENTOR(S) : Martin Standing et al.

Page 1 of 1

It is certified that error appears in the above-identified patent and that said Letters Patent is hereby corrected as shown below:

In the Claims

In Column 10, Line 7, Claim 10, delete "de" and insert --dc--.

Signed and Sealed this
Tenth Day of July, 2018

Andrei Iancu
*Director of the United States Patent and Trademark Office*